(12) United States Patent
Hyvönen

(10) Patent No.: US 7,733,205 B2
(45) Date of Patent: Jun. 8, 2010

(54) ELECTRICALLY DECOUPLED INTEGRATED TRANSFORMER HAVING AT LEAST ONE GROUNDED ELECTRIC SHIELD

(75) Inventor: Lassi Pentti Olavi Hyvönen, Helsinki (FI)

(73) Assignee: Nokia Corporation, Espoo (FI)

( * ) Notice: Subject to any disclaimer, the term of this patent is extended or adjusted under 35 U.S.C. 154(b) by 826 days.

(21) Appl. No.: 11/432,109

(22) Filed: May 10, 2006

(65) Prior Publication Data

US 2006/0202789 A1   Sep. 14, 2006

Related U.S. Application Data

(62) Division of application No. 10/736,809, filed on Dec. 15, 2003, now Pat. No. 7,084,728.

(51) Int. Cl.
*H01F 27/32* (2006.01)
(52) U.S. Cl. .................................................. 336/84 C
(58) Field of Classification Search .................. 336/65, 336/84 R, 84 C, 200, 206–208, 232, 23; 257/531
See application file for complete search history.

(56) References Cited

U.S. PATENT DOCUMENTS

| | | | |
|---|---|---|---|
| 5,150,046 A | 9/1992 | Lim | 323/356 |
| 5,598,327 A | 1/1997 | Somerville et al. | 363/131 |
| 5,877,667 A | 3/1999 | Wollesen | 336/200 |
| 6,031,445 A | 2/2000 | Marty et al. | 336/200 |
| 6,073,339 A * | 6/2000 | Levin | 29/606 |
| 6,420,952 B1 | 7/2002 | Redilla | 336/84 M |
| 6,580,334 B2 | 6/2003 | Simburger et al. | 333/24 R |
| 6,593,838 B2 | 7/2003 | Yue | 336/84 C |
| 6,756,656 B2 | 6/2004 | Lowther | 257/531 |

(Continued)

FOREIGN PATENT DOCUMENTS

JP          04369809 A   *   12/1992

OTHER PUBLICATIONS

"Analytical Modeling and Characterization of Deep-Submicrometer Interconnect", Sylvester, Dennis, Proceedings Of the IEEE, vol. 89, No. 5, May 2001, pp. 634-664.

*Primary Examiner*—Tuyen Nguyen
(74) *Attorney, Agent, or Firm*—Harrington & Smith

(57) ABSTRACT

An integrated circuit, such as a radio frequency integrated circuit (RFIC), has a first layer bearing first metallization patterned for defining a first inductive coil, a second layer bearing second metallization patterned for defining a second inductive coil that overlies the first inductive coil and that is magnetically coupled to the first inductive coil through a third layer interposed between the first layer and the second layer. The third layer bears third metallization for defining an electric shield or electrostatic shield. The third metallization is patterned into a plurality of structures having shapes intended to minimize eddy currents. The electric shield is connected to further metallization that carries a ground potential. The third layer may further bear other metallization for coupling together at least two components of the integrated circuit. The integrated circuit may be fabricated by a CMOS process, and the first and second coils may be a primary coil and a secondary coil, respectively, of a radio frequency transformer. An additional electric shield may also be included, and in this case one electric shield can be coupled to a ground potential associated with the primary coil, and the second electric shield can be coupled to a ground potential associated with the secondary coil.

29 Claims, 10 Drawing Sheets

U.S. PATENT DOCUMENTS

| | | | |
|---|---|---|---|
| 6,794,977 B2 * | 9/2004 | Christensen | 336/200 |
| 2001/0050607 A1 | 12/2001 | Gardner | 336/200 |
| 2003/0001713 A1 | 1/2003 | Gardner | 336/200 |
| 2003/0030534 A1 | 2/2003 | Gu et al. | 336/221 |
| 2003/0071706 A1 | 4/2003 | Christensen | 336/200 |
| 2003/0127686 A1 * | 7/2003 | Lowther et al. | 257/331 |
| 2006/0049481 A1 * | 3/2006 | Tiemeijer et al. | 257/531 |

* cited by examiner

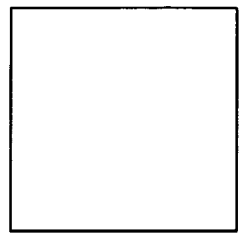 (a) NO SUBSTRATE GROUND (NG)
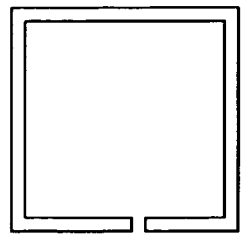 (b) HALO GROUND CONTACT (HG)
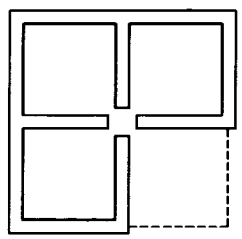 (c) CROSS BAR PATTERN (CBP)
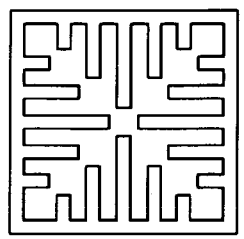 (d) WIDE BAR PATTERN (WBP)
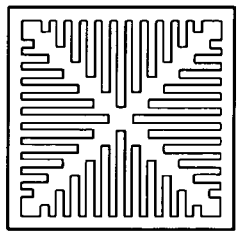 (e) NARROW BAR PATTERN (NBP*)
(CLOSE-LOOP RING CONTACT)
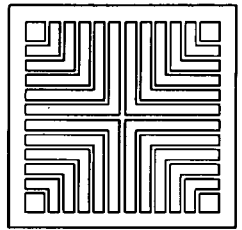 (f) PERFORATED GROUND PLATE (PG*)
(CLOSE-LOOP RING CONTACT)
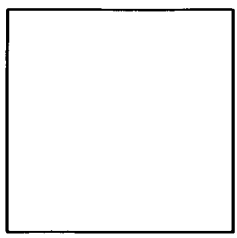 (g) SOLID GROUND PLATE (SG)
FIG.4
PRIOR ART

PART OF RFIC

ELECTRICALLY DECOUPLED INTEGRATED TRANSFORMER HAVING AT LEAST ONE GROUNDED ELECTRIC SHIELD

CROSS REFERENCE TO RELATED APPLICATION

This application is a divisional of U.S. patent application Ser. No. 10/736,809, filed on Dec. 15, 2003 now U.S. Pat. No. 7,084,728, and claims priority thereto.

TECHNICAL FIELD

This invention relates generally to magnetically coupled electrical devices and, more specifically, relates to multi-winding transformers that are fabricated as part of an integrated circuit.

BACKGROUND

The use of an electric shield, also referred to as an electrostatic shield, between primary and secondary coils or windings is well known in the art, such as in power supply and telecommunications applications. An electric shield can be used to prevent a high voltage breakdown from the primary winding to the secondary winding. For example, in the case of the presence of lightning impulse voltage the electric shield conducts the breakdown to ground. An electric shield can also be used to attenuate electrical noise that would otherwise be coupled between the primary and secondary windings.

FIG. 1 shows an elevational view (1A) and an exploded view (1B) of a conventional iron core transformer that has an electric shield, as shown and described in US 2003/0030534 A1, "Transformer Shielding", Gu et al. FIG. 2 shows the electric shield of FIG. 1 in greater detail. Note that the shield is not provided as a continuous sheet of metal, but instead contains a number of cut-out areas forming a comb-type pattern of parallel, electrically conductive traces connected together on one end by a connecting trace. The purpose of using the comb-type shape is to prevent the formation of eddy currents. The presence of eddy currents is disadvantageous, as they increase the losses that occur between the primary and the secondary windings.

FIG. 3 depicts an equivalent circuit of a conventional noise-shielded transformer, such as one shown in U.S. Pat. No. 5,150,046. The shield is shown as being connected to circuit ground. During operation the high frequency magnetic flux in the primary winding, generated by pulse noise, is minimized by being directed to ground through the static capacitance C of the shield winding It is known to use an electric shield under a planar integrated inductor. The electric shield in this case is typically referred to in the literature as a ground shield. The purpose of the ground shield is to prevent noise coupling from a conductive substrate (e.g., bulk silicon). Another purpose of the ground shield is to increase the quality (Q) factor of the inductor, as the lossy ground capacitance is reduced by the presence of the electric shield.

FIGS. 4A-4G, collectively referred to as FIG. 4, show plan view schematics of different conventional metal ground shield structures (FIGS. 4C-4F), in comparison to a floating and a grounded silicon substrate shown in FIGS. 4A and 4B, respectively, and to a solid metal ground plate shown in FIG. 4G. Reference can also be made to: "Progress in RF inductors on silicon-understanding substrate losses", Burghartz, IEEE IEDM'98, pp. 523-526.

FIG. 5 shows an example of a ground shield that can be placed under a planar inductor or a transformer. Reference in this regard can be made to FIG. 7 of commonly assigned US 2003/0071706 A1, "Planar Transformers", by Christensen. In this case an integrated transformer is disposed over the patterned ground shield. The ground shield comprises an array of generally-radially extending fingers connected by a broken ring. The broken ring is positioned some distance inwardly from the outer periphery of the ground shield, in a region where the transformer's magnetic field is parallel to the surface of the substrate on which the transformer is formed: Positioning the connecting ring in this way is said to reduce the series resistance of the shield, when compared with a similar shield with a peripherally-disposed connecting ring.

Also of interest is US 2003/0001713, "Integrated Transformer", by Gardner. In this US Patent a structure is disclosed to include magnetic layers, and thus would have a ferrite core which acts to strengthen the magnetic coupling. The magnetic layer is slotted radially, i.e. perpendicular to the windings, and the slots are used to reduce eddy currents. In this approach, however, the magnetic layers are not disclosed to be used as an electric shield, but simply as a magnetic core.

In US2001/0050607 A1, "Integrated Transformer", Gardner, a structure is baked from dielectric, magnetic and conducting layers. The magnetic layer is composed of an amorphous cobalt alloy, and as such the structure has a ferrite core. An electric shield is not disclosed as forming part of the structure.

In U.S. Pat. No. 6,580,334 B2, "Monolithically Integrated Transformer", Simburger et al. disclose a transformer that is said to be produced according to standard silicon bipolar technology with three metallic layers. The transformer is not disclosed to contain an electric shield.

In U.S. Pat. No. 5,877,667, "On-Chip Transformers", Wollensen discloses embodiments of transformers constructed in separate metal layers in an insulator that serves as a dielectric. The insulator layer is formed on a silicon substrate. The use of an electric shield is not disclosed.

In U.S. Pat. No. 6,031,445, "Transformer for Integrated Circuits", Marty et al. disclose a transformer constructed from four layers of conductive lines separated by insulating layers. The transformer structure does not include an electric shield.

Of most interest to this invention are integrated planar transformers. A planar, integrated transformer 1, or a balun, is basically two planar coils 2 and 3 inter-wound on the same layer (FIG. 6) or on different layers (FIG. 7). The transformer 1 may be considered to be two-mutually-coupled inductors (L1, L2), as shown in FIG. 8. The inductors L1, L2 are coupled to each other with a coupling factor K. An ideal 1:1 transformer 1 has a coupling factor of K=1, while when the coupling is not perfect the coupling factor is less than unity. Mutual inductance is another way to represent the inductive coupling, and corresponds to the coupling factor in the form $M=K(sqrroot(L_1 L_2))$.

Considering the effect of K less than unity, the circuit can be shown as in FIG. 9 in an equivalent presentation, in which a pair of mutual inductances with an inductance equal to the original M are coupled perfectly to each other, i.e., K=1. In addition, serial inductances Ls1 and Ls2, having values L-M, are considered to be uncoupled from one another, and are added in series with the inductances L1' and L2' of the ideal transformer.

In addition to the non-perfect inductive coupling the integrated transformer has capacitance between the primary to the secondary coils.

From the circuit design point of view it would be advantageous to construct a transformer with a high K and negligible capacitance between the primary and the secondary coils. In practice, however, the effect of the low K changes the function of the circuit from a transformer to one resembling a serial-shunt-serial inductance circuit. While such a circuit can be matched (with some difficulty), it typically exhibits a narrowband frequency response. The inherent capacitance can also be significant and may cause, for example, common mode leakage through the transformer. When a transformer is used as a balun the capacitance between the primary and secondary windings can result in an asymmetry in the impedance as seen from the balanced port.

Further, in order to improve a planar integrated transformer in accordance with the prior art could require that magnetic core material be somehow added. As can be appreciated, this would result in additional and possibly non-standard process steps, and would result in increased cost and complexity, and possibly in reduced yield.

Based on the foregoing representative sampling of the art and related discussion, it can be appreciated that a need exists for a transformer that can be constructed using electrically conductive elements disposed in layers of an integrated circuit, and that further includes an electric shield disposed between windings to provide the benefits that accrue from the use of the electric shield. Prior to this invention, this need was not satisfied.

SUMMARY OF THE PREFERRED EMBODIMENTS

The foregoing and other problems are overcome, and other advantages are realized, in accordance with the presently preferred embodiments of these teachings.

In one aspect this invention provides an integrated circuit having a first layer bearing first metallization patterned for defining a first inductive coil, a second layer bearing second metallization patterned for defining a second inductive coil that overlies the first inductive coil and that is magnetically coupled to the first inductive coil through a third layer interposed between the first layer and the second layer. The third layer bears third metallization for defining an electric shield or electrostatic shield, and the third metallization is patterned into a plurality of structures having shapes intended to minimize eddy currents. The electric shield is connected to further metallization that carries a ground potential. The third layer may further bear other metallization for coupling together at least two components of the integrated circuit. The integrated circuit may be fabricated by a CMOS process, and the first and second coils may be a primary coil and a secondary coil, respectively, of a radio frequency transformer. Other processes, such as a BiCMOS process, could also be used to realize the benefits of this invention.

There may also be a fourth layer interposed between the first layer and the second layer, where the fourth layer bears fourth metallization for defining a second electrostatic shield. The fourth metallization is also patterned into a plurality of structures having shapes intended to minimize eddy currents, and is connected to still further metallization that also carries ground potential. The first electrostatic shield may be coupled to a ground potential associated with the primary coil, and the second electrostatic shield may be coupled to a ground potential associated with the secondary coil.

This invention also provides a method to construct a planar transformer in an integrated circuit, and includes: fabricating a first layer bearing first metallization patterned for defining a first inductive coil; fabricating a second layer over the first layer, the second layer bearing second metallization for defining an electric shield, the second metallization being patterned into a plurality of structures having shapes intended to minimize eddy currents, where fabricating the second layer comprises fabricating an electrical connection for coupling the electric shield to a ground potential; and fabricating a third layer over the second layer, the third layer bearing third metallization patterned for defining a second inductive coil that overlies the first inductive coil and that is magnetically coupled to the first inductive coil through the electric shield. Fabricating the second layer may include providing additional metallization associated with other circuitry so that the second layer metallization is shared between forming the electric shield and interconnects and possibly other structures for related or unrelated circuitry. As one example, additional electric shields for other planar transformers can be formed using the second layer.

BRIEF DESCRIPTION OF THE DRAWINGS

The foregoing and other aspects of these teachings are made more evident in the following Detailed Description of the Preferred Embodiments, when read in conjunction with the attached Drawing Figures, wherein:

FIGS. 4A-4G, collectively referred to as FIG. 4, show plan view schematics of different conventional metal ground shield structures (FIGS. 4C-4F), in comparison to a floating and a grounded silicon substrate shown in FIGS. 4A and 4B, respectively, and to a solid metal ground plate shown in FIG. 4G;

DETAILED DESCRIPTION OF THE PREFERRED EMBODIMENTS

Figure 1A:
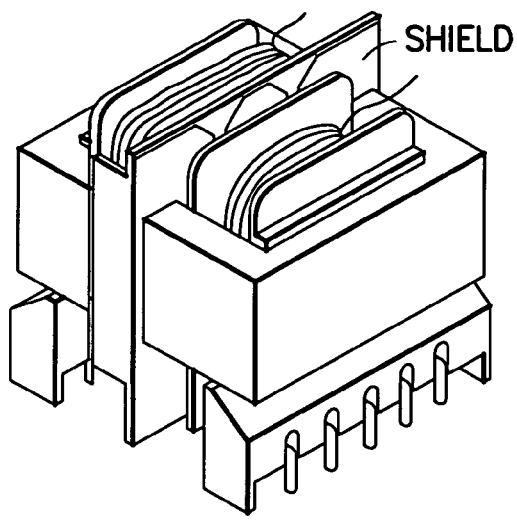
FIG. 1 shows an elevational view (1A) and an exploded view (1B) of a conventional iron core transformer that has an electric shield.
Figure 1B:
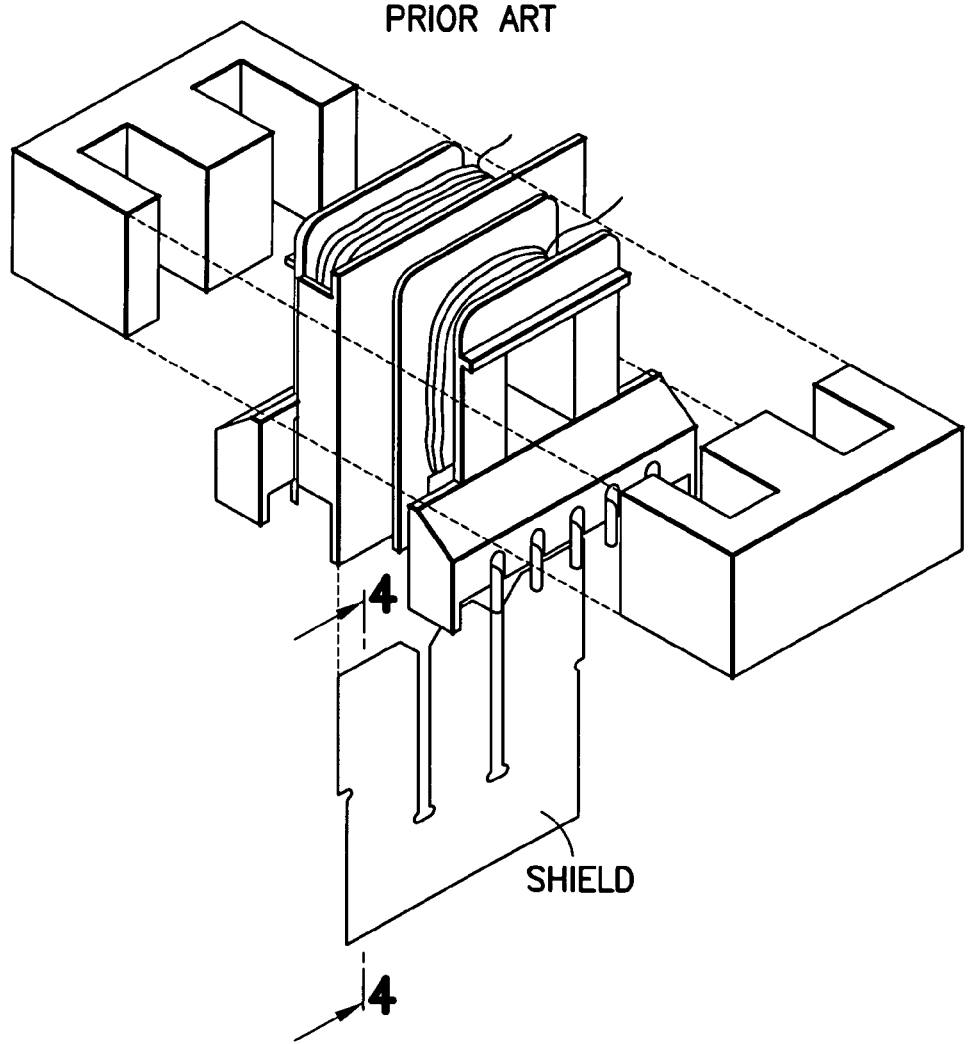
Figure 2:
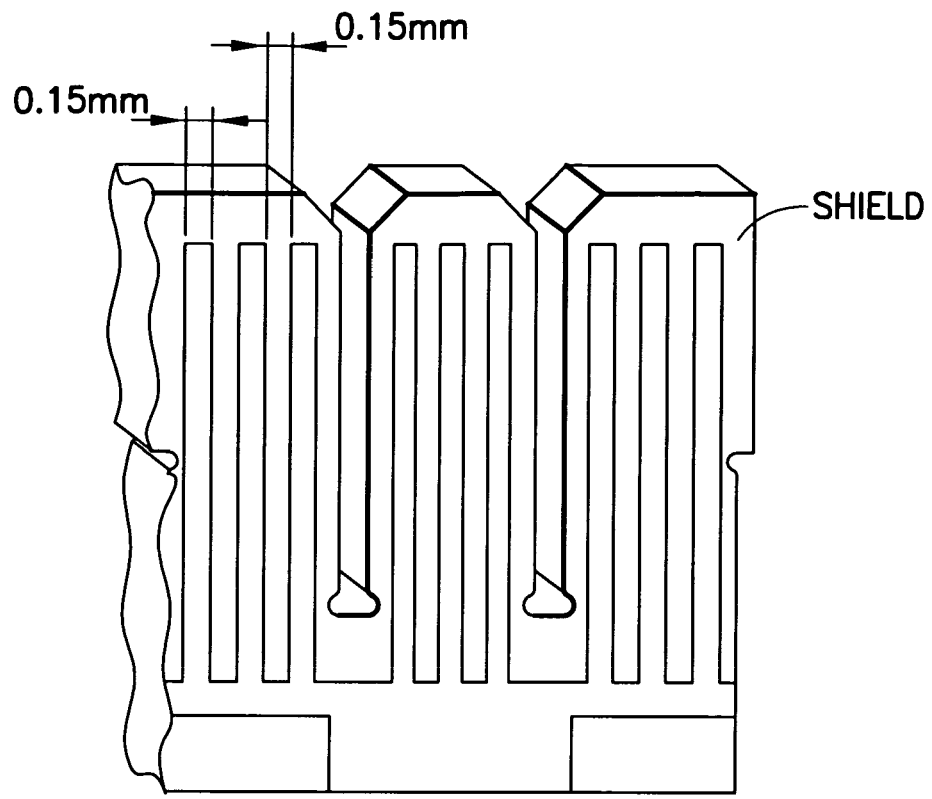
FIG. 2 shows the electric shield of FIG. 1 in greater detail.
Figure 3:
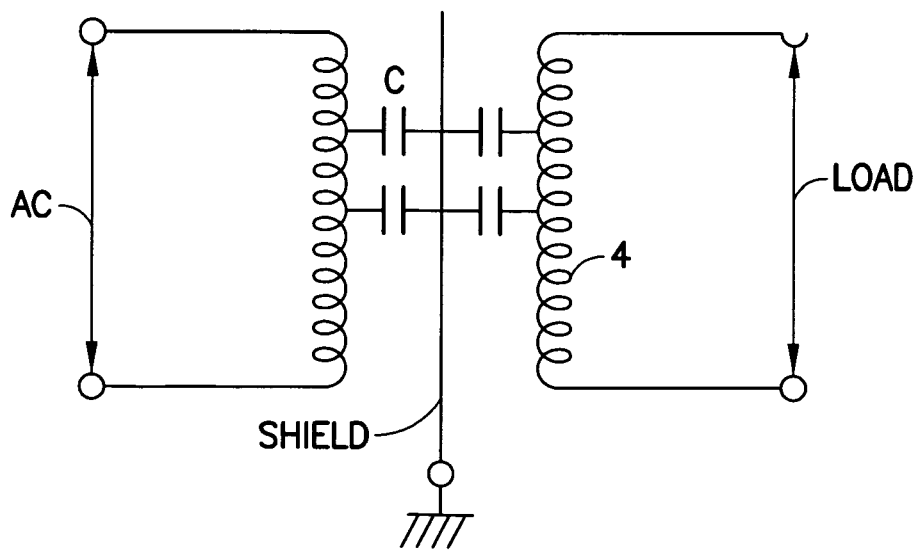
FIG. 3 depicts an equivalent circuit of a conventional noise-shielded transformer.
Figure 5:
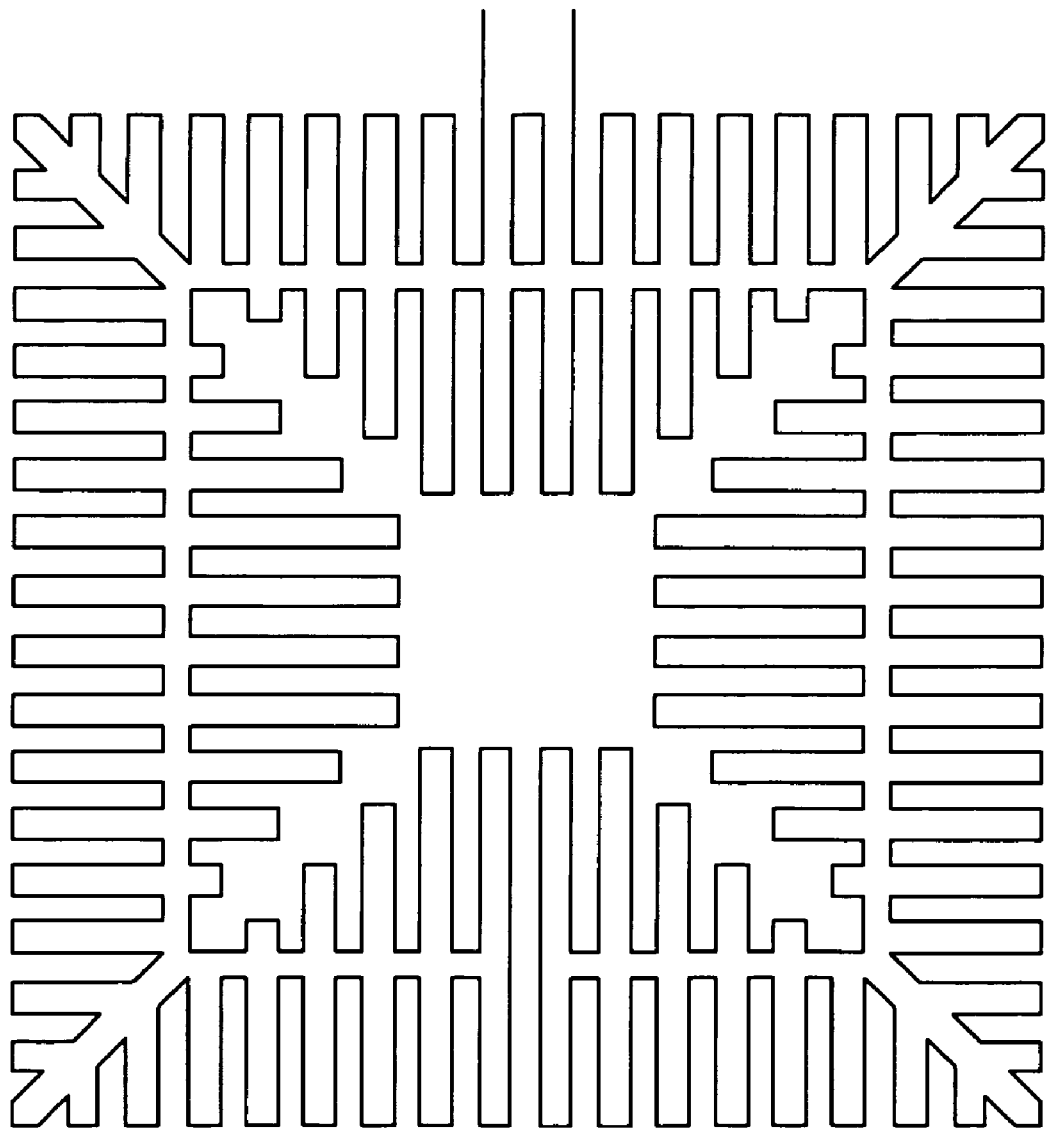
FIG. 5 shows an example of a ground shield that can be placed under a planar inductor or a transformer.
Figure 6:
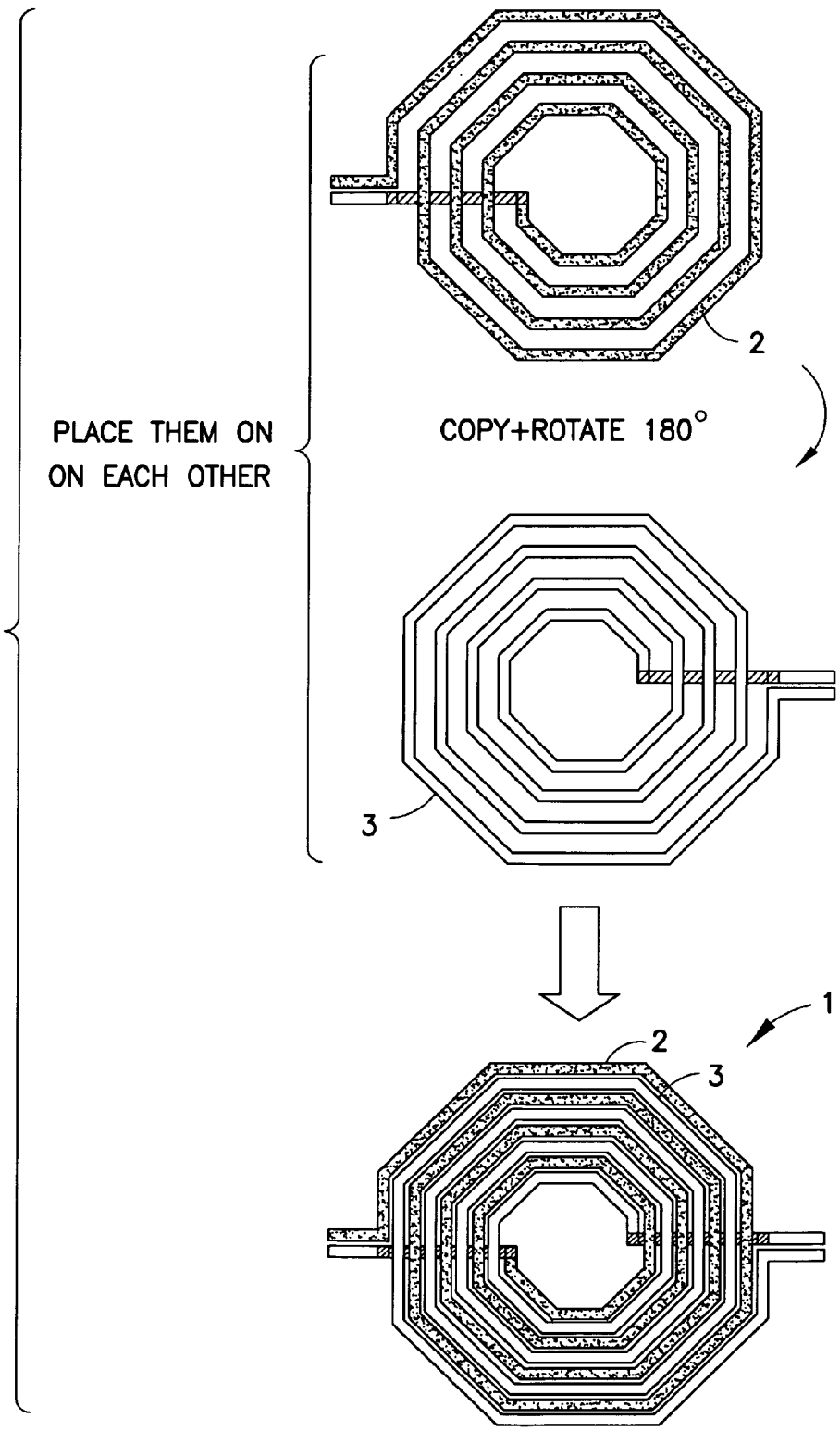
FIG. 6 shows an example of a conventional planar 1:1 interwound transformer with the primary and secondary coils on the same layer.
Figure 7:
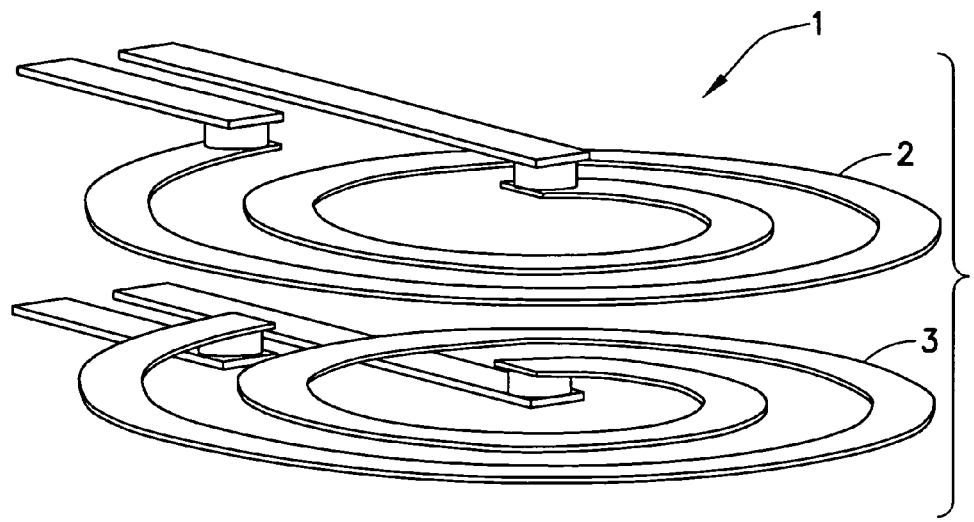
FIG. 7 shows an example of a conventional planar transformer with the primary and secondary coils on different layers.
Figure 8:
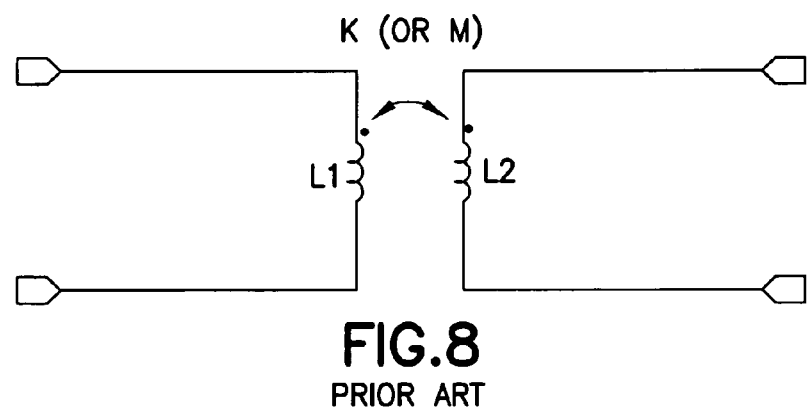
FIG. 8 shows a schematic diagram of a transformer as two-mutually-coupled inductors (L1, L2) having an ideal coupling ratio of unity.
Figure 9:
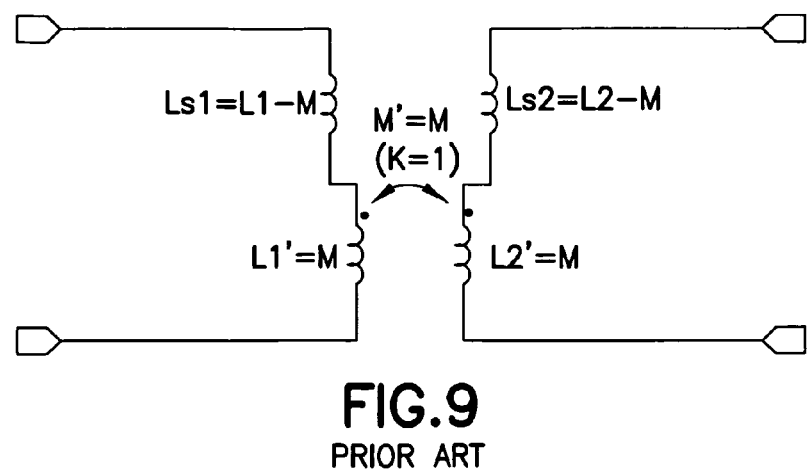
FIG. 9 shows an equivalent presentation of the diagram of FIG. 8, in which a pair of mutual inductances are coupled perfectly to each other, and serial inductances Ls1 and Ls2 considered to be uncoupled from one another are added in series with the inductances L1' and L2' of the ideal transformer, FIGS. 10A, 10B and 10C, collectively referred to as FIG. 10, each show a top, enlarged view of electric shield metallization in accordance with different embodiments of this invention.

By way of introduction, this invention has grown out of an appreciation by the inventor that one of the current trends in integration of RF circuits is CMOS technology, where a main driver for the use of RF CMOS technology is cost reduction. A typical state of the art CMOS back-end process includes several metal layers used primarily for the wiring of the digital circuitry. An example of the use of multiple metal layers for on-chip interconnects can be found in the literature in, as but one example, a publication entitled: "Analytical Modeling and Characterization of Deep-Submicrometer Interconnect", D. Sylvester and C. Hu, Proceedings of the IEEE, Vol. 89, No. 5, May 2001. FIG. 1 of this publication shows an example of a modem backend process. The number of metal layers in future CMOS processes can be expected to increase as the chip size and transistor density per area increase. The metal layers are formed on or in high quality dielectric layers, such as $SiO_2$ layers.

This invention provides an integrated transformer that is constructed to have an electric shield between the primary and the secondary coils to separate the coils electrically, while still enabling very strong magnetic coupling between the primary and secondary coils. The invention takes advantage of the many metal layers offered in a modem CMOS integrated circuit (IC) fabrication processes, although is not limited for use only with CMOS-based IC processes.

Figure 10A:
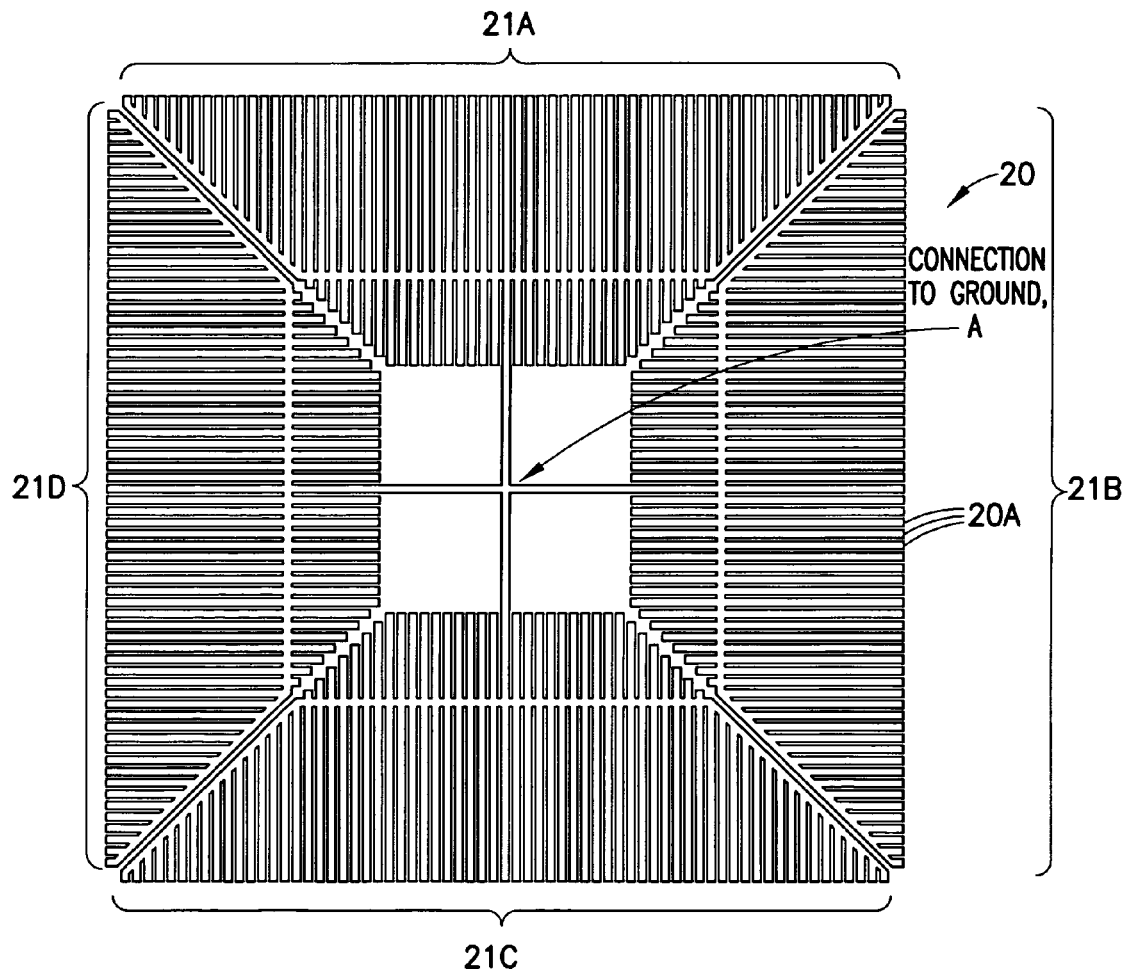

Referring to FIG. 10, in accordance with an embodiment of this invention the primary coil and the secondary coil of the transformer are placed over one another on different layers and between them is a layer where a radial-cut metal shield 20 is placed. The graphic symbol of a transformer with an electric shield between coils is presented in FIG. 11, where the shield 20 is shown connected to the ground. Ideally the shield 20 connects the capacitance between the primary and secondary coils to ground, and prevents or significantly reduces capacitive coupling between the primary and secondary coils. However, the magnetic coupling between the primary and secondary coils (L1 and L2 in FIG. 11) remains strong, since the primary and the secondary coils are still physically very close to one another, despite the intervening electric shield 20 metallization layer.

In the preferred embodiment the electric shield 20 is formed from a plurality of radially disposed metal ribbons 20A to avoid eddy currents being created in the electric shield 20. The ribbons 20A are formed in groups, such as the four groups 21A, 21B, 21C and 21D (collectively referred to as 21) shown in FIG. 10A, which are connected together, and to ground, preferably at about the physical center (marked as A in FIG. 10A) of the overlying and underlying transformer coils (not shown in FIG. 10). The connections between ribbons 20A and the groups of ribbons 21 are made in such a way as to avoid the formation of a loop of the ribbons 20A, and to thereby avoid the formation of undesirable eddy currents.

Figure 10B:
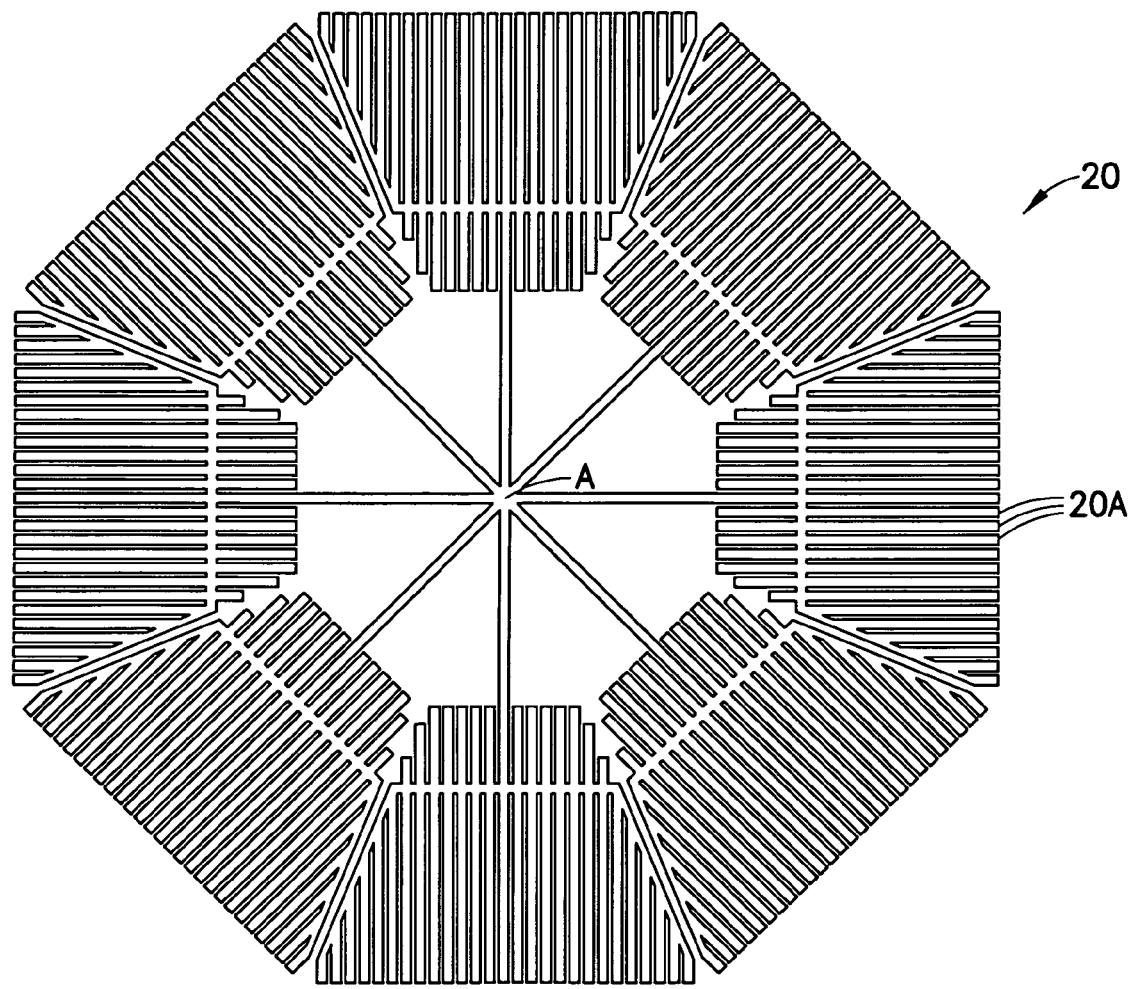
Figure 10C:
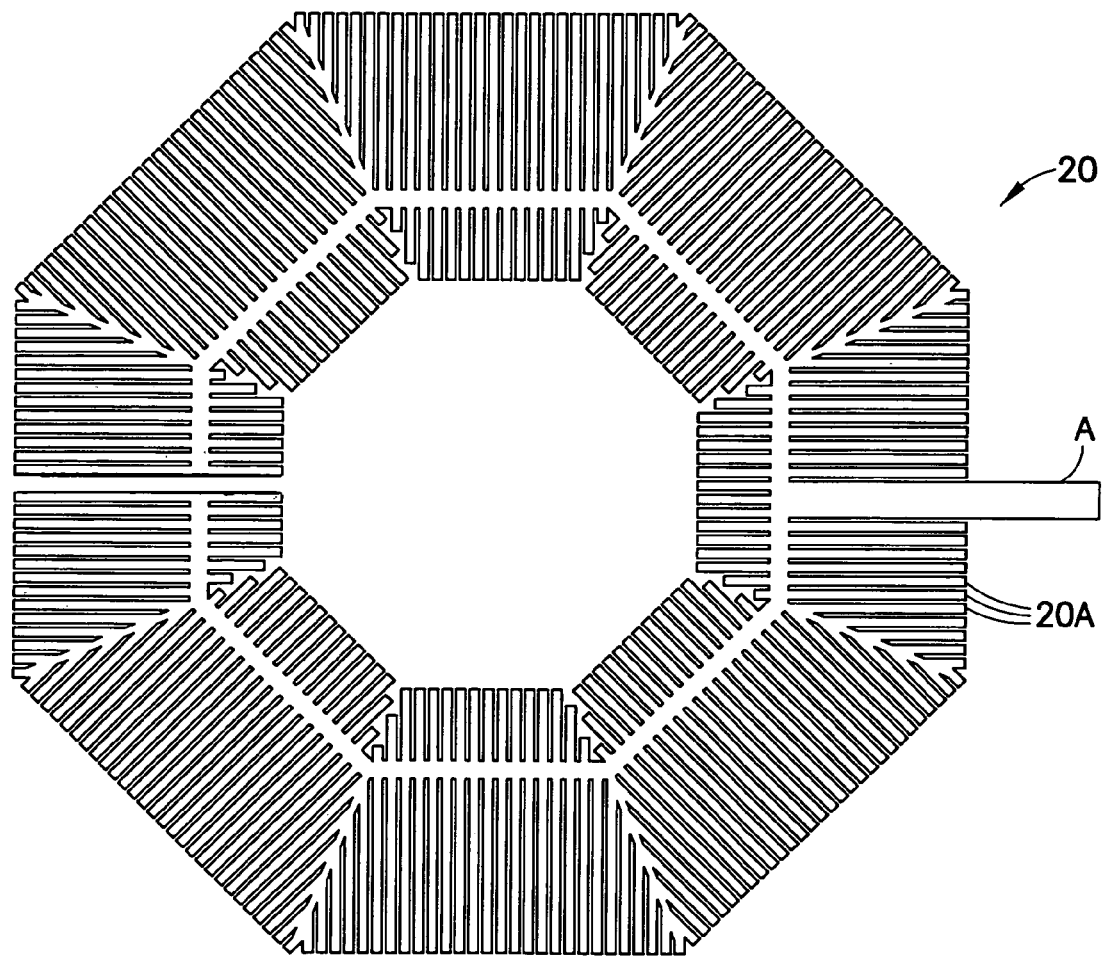
Figure 11:
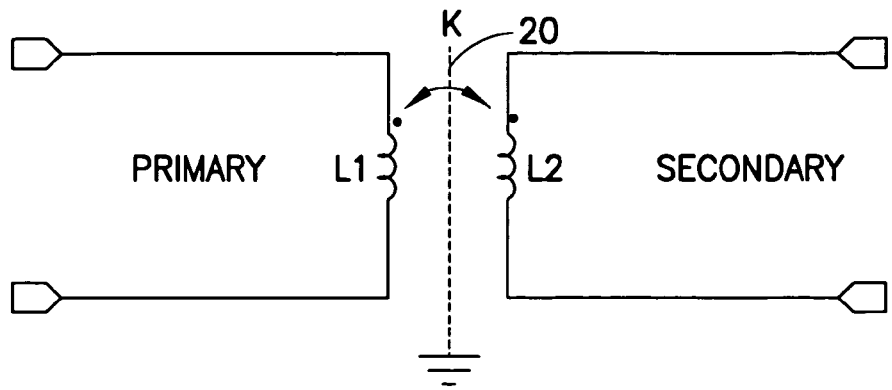
FIG. 11 depicts a graphic symbol of a transformer with the electric shield of FIG. 10 between the primary and secondary coils, where the electric shield is shown connected to ground.

FIGS. 10B and 10C show exemplary octagonal embodiments of the shield 20 (hexagonal and other polyhedral shapes are also within the scope of this invention). Note that in the embodiment of FIG. 10B the ground connection A is also made at about the center of the shield 20, whereas in the embodiment of FIG. 10C the ground connection A is made external to the shield 20.

As a general guideline the width of a single ribbon 20B is not more than twice the skin depth in the metal used in the IC layer in which the electric shield 20 is formed, and the distance between two adjacent ribbons 20A is less than the distance from the primary coil to the secondary coil. Relatedly, it is preferred that the width of the ribbon 20A is of the same order as the width of the gap between ribbons 20A. Note that the skin depth need not be equivalent to the physical thickness of the metal, but is instead the depth into the metal layer that the high frequency RF energy propagates.

As but one non-limiting example, assume that the skin depth for copper at 2 GHz is about 1.5 microns, and assume the use of a conventional CMOS backend process. In this case the distance from a metal layer to the second next layer is about 1.15 microns. Based on these parameters the width (W) of a single ribbon 20A may be about 1 micron, and the distance between two adjacent ribbons 20A may be about 0.5 micron.

In the preferred embodiment of this invention the electrically conductive material, typically a metal, that forms the electric shield 20 is a non-ferrous metal or metal alloy. For example, it could be copper, or aluminum, or gold, or silver, or mixtures, alloys or multi-layered films thereof, as may be conventionally used in the integrated circuit fabrication art for forming electrically conductive interconnects.

However, in other embodiments of this invention the use of electrically conductive non-metals may be used in whole or in part, such as doped polysilicon, so long as the electrical conductivity is sufficiently high so as to provide a good quality electric shield, and the selected electrically conductive material is compatible with the IC process that is being used.

Figure 12:
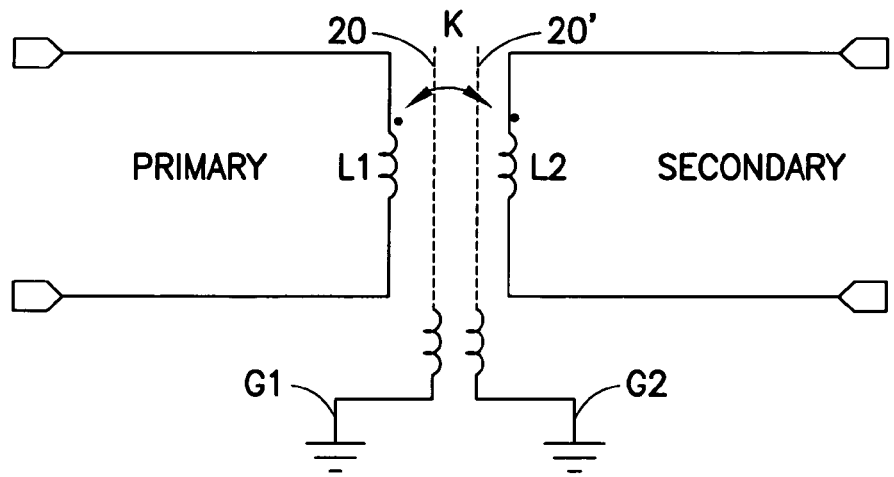
FIG. 12 depicts a graphic symbol of a transformer having more than one electric shield can be disposed between the primary and secondary coils, where the electric shield closer to the primary coil may be connected to a ground used in the circuit connecting to the primary coil, and where the electric shield closer to the secondary coil may be connected to a ground used in the circuit connected to the secondary coil.

It may be the case that the grounding of the shield 20 is not perfect, and that some residual inductance from the shield 20 to ground remains. As can be appreciated, this makes the choice of the grounding configuration important. In accordance with a further aspect of this invention, and referring to FIG. 12, more than one electric shield 20 can be disposed between the primary and secondary coils L1 and L2, respectively. Assuming as an example the use of two shields 20 and 20', the shield closer to the primary coil L1 is connected to the ground (G1) used in the circuit connecting to the primary coil L1, and similarly the second shield 20' (the one closer to the secondary coil L2) is connected to the ground (G2) used in the circuit connected to the secondary coil L2. While noise may still exist in the shields 20 and 20', the coupling of the noise between the primary coil L1 and the secondary coil L2 is reduced in strength because of the formation of the effective series capacitance connections between the primary and secondary coils.

It can be noted that the use of this invention effectively enhances the strength of the magnetic coupling between the primary coil and the secondary coil. This is true because the presence of the shield 20, or the shields 20 and 20', significantly reduces the inter-coil capacitance, thereby enabling the two coils to be placed closer to one another than could be done in the prior art (without suffering from undesirable increased noise coupling), which in turn strengthens the magnetic coupling between the primary and the secondary coils L1 and L2.

Figure 13:
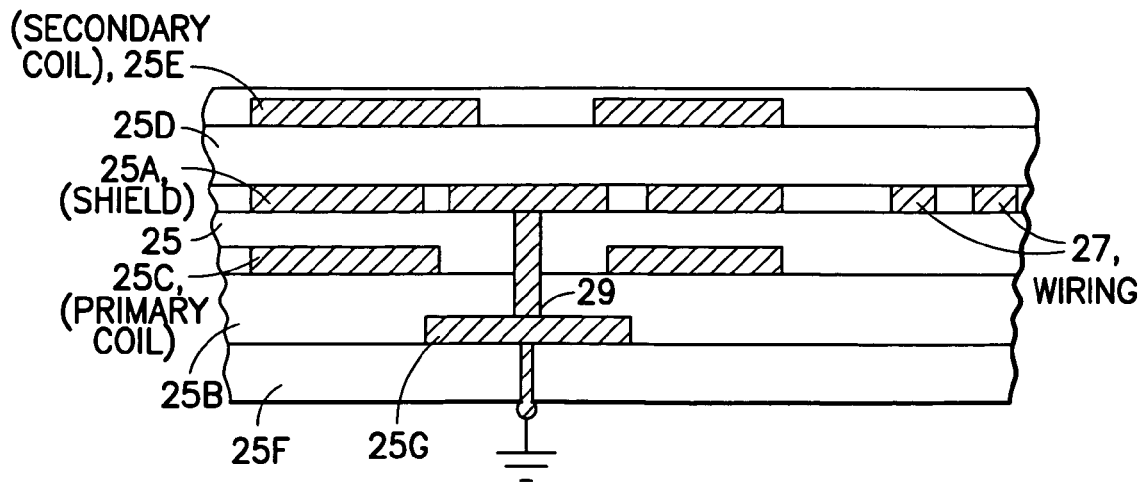
FIG. 13 is an enlarged, cross-section view of an integrated circuit constructed to have a planar transformer having a grounded electric shield disposed between the primary and secondary coils.

Referring now to FIG. 13, a farther advantage of this invention is that a layer 25 that bears the shield 20 metallization 25A, and which lies between the layer 25B that bears the primary coil metallization 25C and the layer 25D that bears the secondary coil metallization 25E, can be used as well for other purposes, such as providing wiring 27 between other circuits in the IC. These other circuits could be related to the transformer circuit, or they could be unrelated to the transformer circuit. In this non-limiting example a via 29 is shown for connecting the shield 20 metallization to a desired ground potential, shown as a ground potential carried by further metallization 25G disposed on a further IC layer 25F. FIG. 13 can be considered to show in cross-section a part of an RFIC that is fabricated using a multi-metal layer CMOS process, or any other suitable IC process.

It should be noted that the RFIC could contain a plurality of transformers, and that the layer 25 could bear the shield metallization for each of the plurality of transformers. The layer 25 may also optionally carry wiring/interconnects that is related to one or more of the plurality of transformers, or that is unrelated to any of the plurality of transformers. It should be further noted that in the presently preferred embodiments of this invention the shield 20 can be implemented without adding any process steps to the RFIC fabrication process.

Also, in that the majority of transformers are of the balanced type, the shielding in accordance with this invention can be used to improve the symmetry of the balanced transformer.

The foregoing description has provided byway of exemplary and non-limiting examples a full and informative description of the best method and apparatus presently contemplated by the inventors for carrying out the invention. However, various modifications and adaptations may become apparent to those skilled in the relevant arts in view of the foregoing description, when read in conjunction with the accompanying drawings and the appended claims. As but some examples, the use of other different, similar or equivalent IC processes, types of metallization or other electrically conductive materials, dimensions and the like maybe attempted by those skilled in the art. However, all such and similar modifications of the teachings of this invention will still fall within the scope of this invention.

Furthermore, some of the features of the present invention could be used to advantage without the corresponding use of other features. As such, the foregoing description should be considered as merely illustrative of the principles of the present invention, and not in limitation thereof.

What is claimed is:

1. An apparatus comprising:
   a first dielectric layer in an integrated circuit comprising a first inductance;
   a second dielectric layer in the integrated circuit comprising a second inductance that is spaced from the first inductance and that overlies the first inductance;
   an electrically conductive shield in the integrated circuit, disposed between the first and second inductances and spaced from each of the first and second inductances, for coupling a capacitance between the first and second inductance to ground, in which the electrically conductive shield comprises a plurality of radially extending conductive shapes that are spaced from one another and electrically coupled to one another.

2. The apparatus of claim 1, wherein the electrically conductive shield is a first shield, the apparatus further comprising a second electrically conductive shield disposed between the first shield and the second inductance, spaced from each of the first shield and the second inductance, and coupled to ground.

3. The apparatus of claim 2, wherein the first shield and first inductance are coupled to a common first grounding metallization of the integrated circuit, and the second shield and the second inductance are coupled to a common second grounding metallization of the integrated circuit.

4. The apparatus of claim 1, wherein the shield couples the capacitance to ground at a location outboard of the shield.

5. The apparatus of claim 1, wherein the shield couples the capacitance to ground at a location substantially aligned with a geometric center of one of the first or second inductances.

6. The apparatus of claim 1, wherein the shapes are electrically coupled to one another such that none of the said shapes forms a loop with any other said shape.

7. The apparatus of claim 6, wherein the radially extending conductive shapes are electrically coupled to one another by a broken ring.

8. The apparatus of claim 7, wherein the broken ring is disposed inboard of an outer periphery of the shield.

9. The apparatus of claim 6, wherein the shapes comprise ribbons.

10. The apparatus of claim 9, wherein each ribbon defines a width no greater than the distance between the shield and the nearer of the first or second inductor.

11. The apparatus of claim 9, wherein a distance between any two adjacent ribbons is no greater than half the distance between the shield and the nearer of the first or second inductor.

12. The apparatus of claim 9, wherein the ribbons define a common width, and a spacing between any two adjacent ribbons is about half the common width.

13. The apparatus of claim 9, wherein the radially extending ribbons are formed in groups of ribbons, each ribbon of a group coupled to other ribbons of the group, and each group coupled to each other group at a common connection to ground.

14. The apparatus of claim 13, wherein said common connection to ground is disposed at about a physical center of the groups.

15. The apparatus of claim 1, wherein the shield is formed of an electrically conductive non-metal.

16. The apparatus of claim 1, wherein the shield couples a capacitance between the first and second inductances to ground through use of a conductive via that penetrates at least one of the first and second dielectric layers to contact grounding metallization of the integrated circuit.

17. An apparatus comprising:
   a first inductive coil;
   a second inductive coil overlying the first inductive coil;
   a first electric shield disposed between the first and second inductive coils; and
   a second electric shield disposed between and spaced from each of the first electric shield and the second inductive coil;
   wherein each of the first and second electric shields comprises a plurality of radially extending electrically conductive ribbons coupled to one another in a manner such that no ribbon forms a loop with any other ribbon.

18. The apparatus of claim 17, wherein the first inductive coil and the first shield are grounded to a first grounding metallization, and the second conductive coil and the second shield are grounded to a second grounding metallization.

19. An integrated circuit comprising:
   a planar first coil of conductive material disposed in a first dielectric layer;
   a planar second coil of conductive material disposed in a second dielectric layer, the second coil of conductive material overlying the first coil of conductive material and magnetically coupled to the first coil of conductive material through a shield disposed between the first coil of conductive material and the second coil of conductive material;

the shield configured to couple a capacitance between the first coil of conductive material and the second coil of conductive material, and to provide an inductance to a ground potential, the shield comprising a planar conductive material patterned into a plurality of radially extending ribbons coupled to a common point that lies in a same plane as the ribbons, said point coupled to the ground potential.

20. An integrated circuit comprising:
a planar first coil of conductive material disposed in a first dielectric layer;
a planar second coil of conductive material disposed in a second dielectric layer, the second coil of conductive material overlying the first coil of conductive material and magnetically coupled to the first coil of conductive material through a shield disposed between the first coil of conductive material and the second coil of conductive material;
the shield configured to couple a capacitance between the first coil of conductive material and the second coil of conductive material, and to provide an inductance to a ground potential, the shield comprising a planar conductive material patterned into a plurality of radially extending ribbons, each of said ribbons coupled to each other of said ribbons such that no ribbon forms a loop with any other ribbon.

21. The integrated circuit of claim 20, wherein the first coil is formed of a conductive metal and the second coil is formed of a conductive metal.

22. The integrated circuit of claim 20, wherein each ribbon defines a width no greater than the distance between the shield and the nearer of the first or second coil.

23. The integrated circuit of claim 20, wherein a distance between any two adjacent ribbons is no greater than half the distance between the shield and the nearer of the first or second coil.

24. The integrated circuit of claim 20, wherein all ribbons define a common width, and a spacing between any two adjacent ribbons is about half the common width.

25. A transformer in an integrated circuit comprising:
a first inductor in or on a first integrated circuit layer;
a second integrated circuit layer overlying the first inductor;
an electric shield over the second integrated circuit layer and overlying the first inductor, said electric shield patterned into a plurality of radially extending electrically conductive ribbons, each ribbon coupled to a common point;
a third integrated circuit layer over the electric shield; and
a second inductor in or on the third integrated circuit layer and overlying the electric shield such that at least a portion of the third integrated circuit layer separates the second inductor from the electric shield;
wherein the common point is electrically coupled to grounding metallization of the integrated circuit; and
wherein at least one of:
each of the radially extending ribbons defines a width that is a function of a frequency of an electrical signal that is to be applied to the first or second inductors; and
adjacent ones of said ribbons are spaced from one another by a distance that is a function of a spacing between the first and second inductors.

26. A transformer in an integrated circuit comprising:
a first inductor in or on a first integrated circuit layer;
a second integrated circuit layer overlying the first inductor;
an electric shield over the second integrated circuit layer and overlying the first inductor, said electric shield patterned into a plurality of radially extending electrically conductive ribbons, each ribbon coupled to a common point;
a third integrated circuit layer over the electric shield; and
a second inductor in or on the third integrated circuit layer and overlying the electric shield such that at least a portion of the third integrated circuit layer separates the second inductor from the electric shield;
wherein the common point is electrically coupled to grounding metallization of the integrated circuit
wherein adjacent ones of said ribbons are spaced from one another by a distance that is on the order of twice a width of said adjacent ones of said ribbons.

27. The transformer of claim 25, wherein each of the second and third IC layers comprises a dielectric material.

28. The apparatus of claim 1, further comprising a third dielectric layer disposed between the first and second inductances.

29. The apparatus of claim 28, wherein the first and second inductances are magnetically coupled through the third dielectric layer.

* * * * *